(12) United States Patent
Huang

(10) Patent No.: US 11,647,653 B2
(45) Date of Patent: May 9, 2023

(54) OLED DISPLAY PANEL

(71) Applicant: SEEYA OPTRONICS CO., LTD., Shanghai (CN)

(72) Inventor: Zhongshou Huang, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 216 days.

(21) Appl. No.: 17/140,700

(22) Filed: Jan. 4, 2021

(65) Prior Publication Data

US 2022/0037434 A1   Feb. 3, 2022

(30) Foreign Application Priority Data

Jul. 29, 2020   (CN) .......................... 202010746025.1

(51) Int. Cl.
   H10K 59/124   (2023.01)

(52) U.S. Cl.
   CPC ......... H10K 59/124 (2023.02); *H10K 59/131* (2023.02); *H10K 2102/311* (2023.02)

(58) Field of Classification Search
   CPC ............................................ H01L 27/32–3293
   See application file for complete search history.

(56) References Cited

U.S. PATENT DOCUMENTS

| | | | |
|---|---|---|---|
| 2008/0024402 A1* | 1/2008 | Nishikawa | H10K 50/813 |
| | | | 345/82 |
| 2008/0122347 A1 | 5/2008 | Lee | |
| 2011/0291119 A1* | 12/2011 | Ryu | H01L 27/3276 |
| | | | 257/E27.121 |
| 2013/0113368 A1 | 5/2013 | Min | |
| 2015/0294612 A1 | 10/2015 | Kim et al. | |
| 2017/0005286 A1* | 1/2017 | Yun | H10K 50/822 |
| 2017/0092705 A1* | 3/2017 | Lim | H10K 59/1213 |
| 2017/0125489 A1* | 5/2017 | Jang | H10K 71/00 |
| 2018/0076270 A1 | 3/2018 | Kwon et al. | |
| 2018/0247980 A1* | 8/2018 | Jang | H01L 27/3258 |
| 2019/0074331 A1* | 3/2019 | Oh | H01L 51/5209 |
| 2019/0135019 A1 | 5/2019 | Endo | |
| 2019/0221761 A1 | 7/2019 | Hwang et al. | |

FOREIGN PATENT DOCUMENTS

| | | |
|---|---|---|
| CN | 103928626 A | 7/2014 |
| CN | 104751747 A | 7/2015 |
| CN | 104952884 A | 9/2015 |

(Continued)

OTHER PUBLICATIONS

Second Office Action for Chinese Application No. 2022041902485690, dated Apr. 22, 2022.

(Continued)

*Primary Examiner* — Bryan R Junge
(74) *Attorney, Agent, or Firm* — Wolf, Greenfield & Sacks, P.C.

(57) ABSTRACT

An OLED display panel comprises a plurality of concave-convex structures in each sub-pixel, and a light-emitting layer conformal to the concave-convex structure. The number of the concave-convex structures in each pixel varies depending upon the distance from center to peripheral of the OLED display panel, to compensate brightness variations caused by voltage drops and improve white balance of display image.

11 Claims, 8 Drawing Sheets

(56) References Cited

FOREIGN PATENT DOCUMENTS

| | | | |
|---|---|---|---|
| CN | 105093669 A | 11/2015 |
| CN | 107104130 A | 8/2017 |
| CN | 107819010 A | 3/2018 |
| CN | 107908038 A | 4/2018 |
| CN | 109473455 A | 3/2019 |
| CN | 109904204 A | 6/2019 |
| CN | 109950285 A | 6/2019 |
| CN | 111047991 A | 4/2020 |

OTHER PUBLICATIONS

Extended European Search Report dated Jul. 19, 2021 in connection with European Application No. 21154019.0.
Chinese Office Action dated Oct. 8, 2021 in connection with Chinese Application No. 202010746025.1.

\* cited by examiner

OLED DISPLAY PANEL

CROSS-REFERENCE TO RELATED APPLICATION(S)

This application claims priority to Chinese Patent Application No. 202010746025.1 filed Jul. 29, 2020, which is incorporated herein by reference in its entirety.

TECHNICAL FIELD

The present disclosure relates to the field of organic light-emitting diode (OLED hereinafter) display technology and, in particular, to an OLED display panel.

BACKGROUND

In recent years, OLED display panels have gradually become the mainstream of mobile display terminal screens and middle size display screens. An OLED display panel includes multiple sub-pixels arranged in an array. Each sub-pixel includes a pixel driving circuit and a light-emitting element electrically connected to the pixel driving circuit.

Due to miniaturization of the OLED display in AR and VR applications, and due to significant improvement of image resolution of the OLED display in mobile communication applications, the dimensions of the sub-pixel has gradually come to a micrometer range. Because a dark zone positioned between each sub-pixel does not contribute light output and is not scaled down as the sub-pixel does, light output per unit area, or in other words, the brightness of the OLED display panel, decreases with the sub-pixel dimension. To compensate the decrease in brightness, in the related art, a higher driving voltage of the OLED or a higher current density in the OLED is applied. However, a higher current density will inevitably cause a larger voltage drop along power lines which supply OLED current to each sub-pixel, resulting in discrepancy in driving voltage of each OLED, and therefore location-dependent brightness variations across the entire OLED display panel.

SUMMARY

Embodiments of the present disclosure provide an approach for an OLED display panel to improve display performance to support development of miniaturization and high resolution in the OLED display technology.

An embodiment of the present disclosure provides an OLED display panel, including a substrate and a pixel array.

The pixel array is disposed on the substrate and includes a plurality of pixels arranged in an orthogonal matrix; where each of the plurality of pixels includes a plurality of sub-pixels, and each of the plurality of sub-pixels includes a driving circuit layer, an uneven layer, and a light-emitting element layer stacked in manufacturing process sequence.

The uneven layer in each sub-pixel includes a plurality of convex-concave structures.

The number of concave-convex structures in the sub-pixel monotonically decreases or increases from a center of the pixel array to a periphery of the pixel array in a first direction and/or a second direction, where the first direction and the second direction are orthogonal to each other.

In the OLED display panel provided by the embodiments of the present disclosure, the light-emitting layer conformal to the concave-convex structures has increased a surface area, so that the effective light-emitting area of the OLED display panel is increased and the brightness of the OLED display panel is enhanced accordingly. The number of the concave-convex structures in each pixel varies depending upon the distance from center to peripheral of the OLED display panel in the first direction and/or the second direction. The first direction and the second direction are orthogonal to each other. When the number of concave-convex structures monotonically decreases from the center to the periphery of the pixel array, a driving voltage of the light-emitting layer at a center is avoided to be lower than a driving voltage of the light-emitting layer at a periphery due to a voltage drop caused by impedance of a power line of the OLED display panel, and the brightness of the light-emitting layer at the center is avoided to be lower than that of the light-emitting layer at the periphery. When the number of concave-convex structures in the pixel monotonically increases from the center to the periphery, the brightness of the periphery is avoided to be darker than that of the center in a case where the OLED display panel is displaying in a dark environment or weak rays reaching the human eyes is solved when human observes a large screen and a large viewing angle of the periphery of the screen occurs.

DETAILED DESCRIPTION

Figure 1:
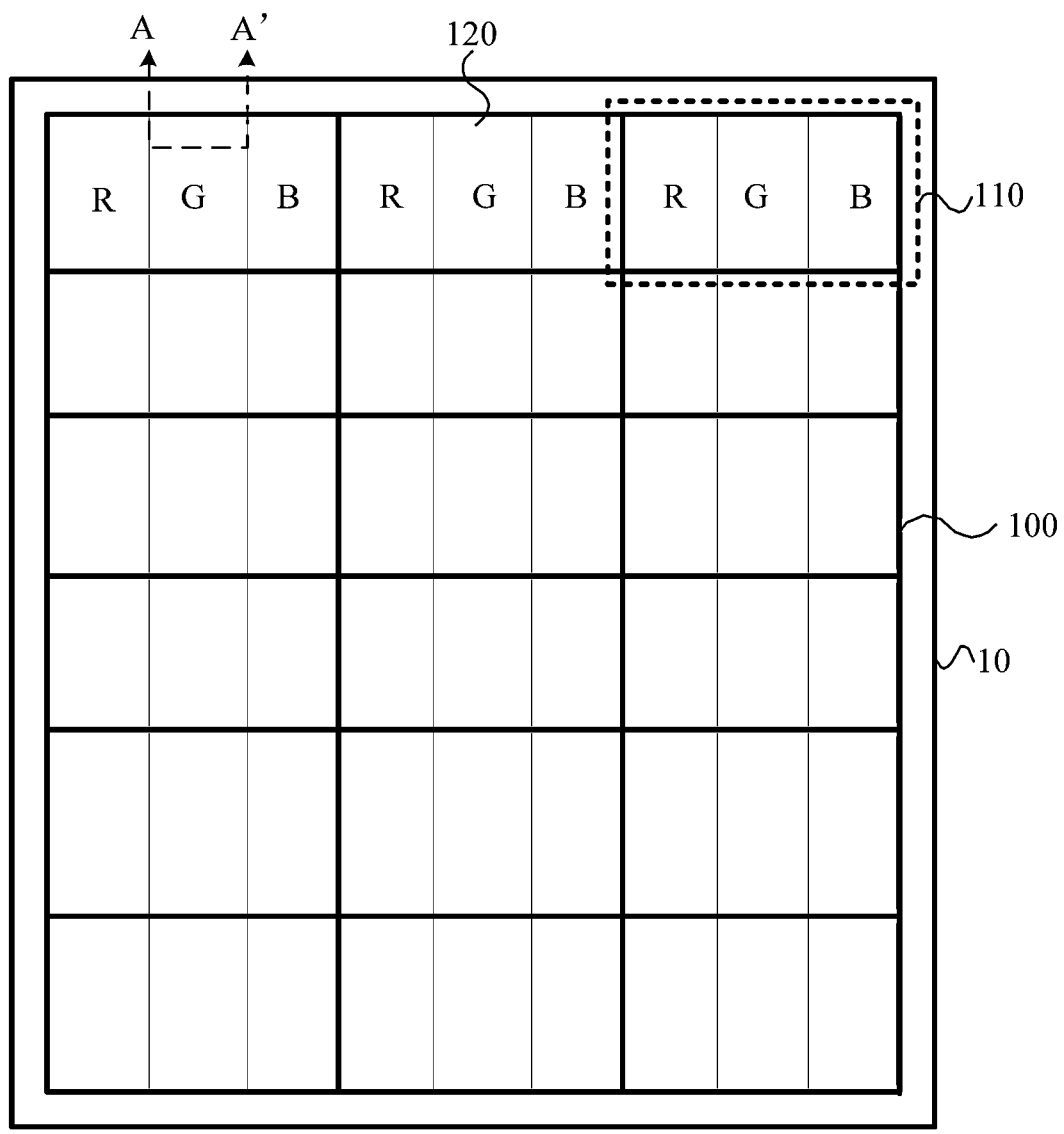
FIG. 1 shows a plane view of an OLED display panel according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

An embodiment of the present disclosure provides an OLED display panel, including a substrate and a pixel array which is disposed on the substrate and includes a plurality of pixels arranged in an orthogonal matrix. Each of the plurality of pixels includes a plurality of sub-pixels, and each of the plurality of sub-pixels includes a driving circuit layer, an uneven layer, and a light-emitting layer stacked in manufacturing process sequence. The uneven layer includes a plurality of concave-convex structures, that the number of the concave-convex structures monotonically decreases or increases from the center of the pixel array to the periphery of the pixel array in a first direction and/or a second direction, and the first direction and the second direction are orthogonal to each other. According to the above arrangement, the light-emitting layer conformal to the concave-convex structure has increased a surface area, so that the effective light-emitting area of the OLED display panel is increased and the brightness of the OLED display panel is enhanced accordingly.

Figure 2:
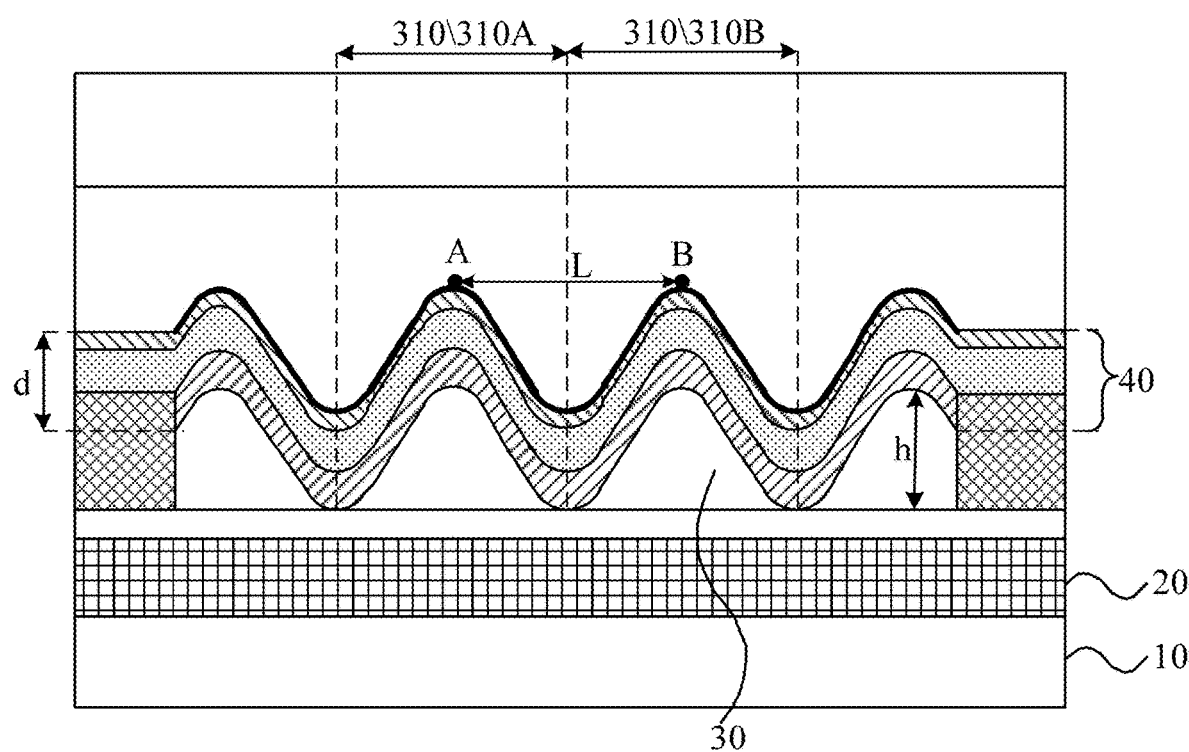
FIG. 2 illustrates a cross-sectional view of the OLED display panel illustrated in FIG. 1 taken along a section line A-A'.
Figure 3:
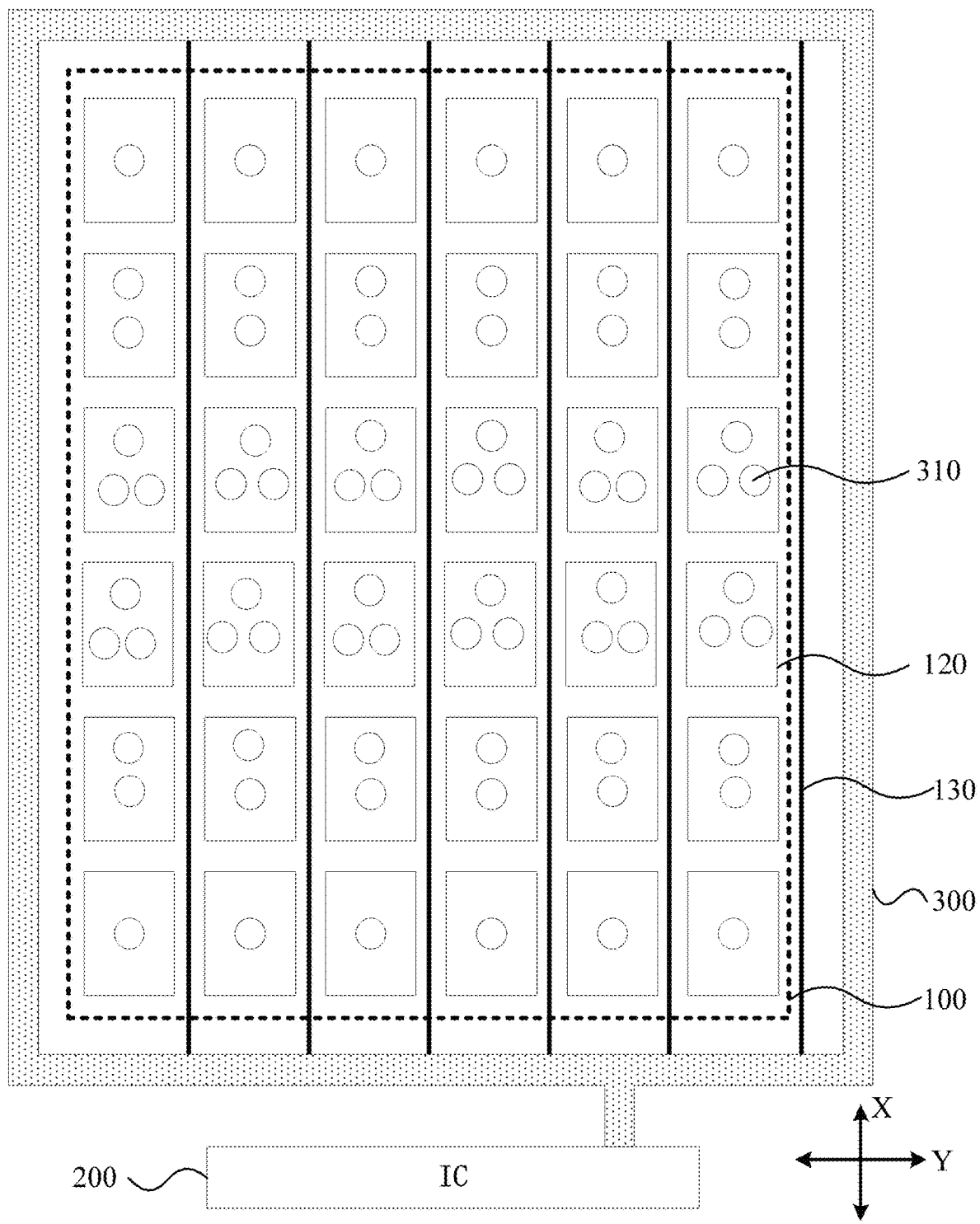
FIG. 3 shows a plane view of concave-convex structures in an OLED display panel according to embodiments of the present disclosure.

FIG. 1 shows a plane view of an OLED display panel according to embodiments of the present disclosure, FIG. 2 illustrates a cross-sectional view of the OLED display panel illustrated in FIG. 1 taken along a section line A-A'; and FIG. 3 shows a plane view of concave-convex structures in an OLED display panel according to embodiments of the present disclosure. As shown in FIGS. 1, 2 and 3, the OLED display panel includes the substrate 10 and the pixel array 100 which is disposed on the substrate 10 and includes the plurality of pixels 110 arranged in an orthogonal matrix. Each pixel 110 includes the plurality of sub-pixels 120, and each sub-pixel 120 includes the driving circuit layer 20, the uneven layer 30, and the light-emitting layer 40 stacked in manufacturing process sequence. The uneven layer 30 in each sub-pixel 120 includes the plurality of concave-convex structures 310. The number of concave-convex structures 310 monotonically decreases or increases from the center of the pixel array 100 to the periphery of the pixel array 100 in the first direction and/or the second direction, and the first direction and the second direction are orthogonal to each other (FIG. 3 exemplarily shows that the number of concave-convex structures 310 in the sub-pixel 120 monotonically decreases from the center of the pixel array 100 to the periphery of the pixel array 100 in the first direction X, where the first direction X is a row direction of the pixel array, and the second direction Y is a column direction of the pixel array).

As shown in FIGS. 1 and 2, the uneven layer 30 is disposed and includes the concave-convex structures 310, so that when the light-emitting layer 40 is formed on the uneven layer 30, an effective light-emitting area of the light-emitting layer 40 formed on the uneven layer 30 increases due to the existence of the concave-convex structures 310. For a high resolution OLED display panel, wherein a sub-pixel has a relatively smaller area, adding the uneven layer 30 underneath the light-emitting layer will help the high resolution display maintain high brightness.

As shown in FIG. 2, the surface profile of the light-emitting layer 40 appears to exactly conform to the surface profile of the uneven layer 30. In a real manufacturing process, due to characteristics of thin film coverage on an uneven surface and process variations, the surface profile of the light-emitting layer 40 formed on the uneven layer 30 may be slightly different from the surface profile of the uneven layer 30.

As shown in FIG. 3, the OLED display panel has a large amount of sub-pixels 120 distributed across the entire display screen. Driving voltage supplied by peripheral driving IC chip has to go through various distances to reach a sub-pixel inside the OLED display. A phenomenon called "voltage drop" occurs due to driving current on a resistive power line, and a location-dependent non-uniformity of brightness across the entire OLED display will occur. More specifically, the center of the OLED display panel appears to be darker than the periphery of the OLED display panel. To compensate this non-uniformity of brightness, in the present disclosure, the number of concave-convex structures 310 is set to gradually increase from an edge of the OLED display panel to the center of the OLED display panel. As a result, the increased number of the concave-convex structure near the center of the OLED display panel may lift the brightness near the center to the level approximately equal to the brightness in the peripheral of the OLED display panel.

Figure 4:
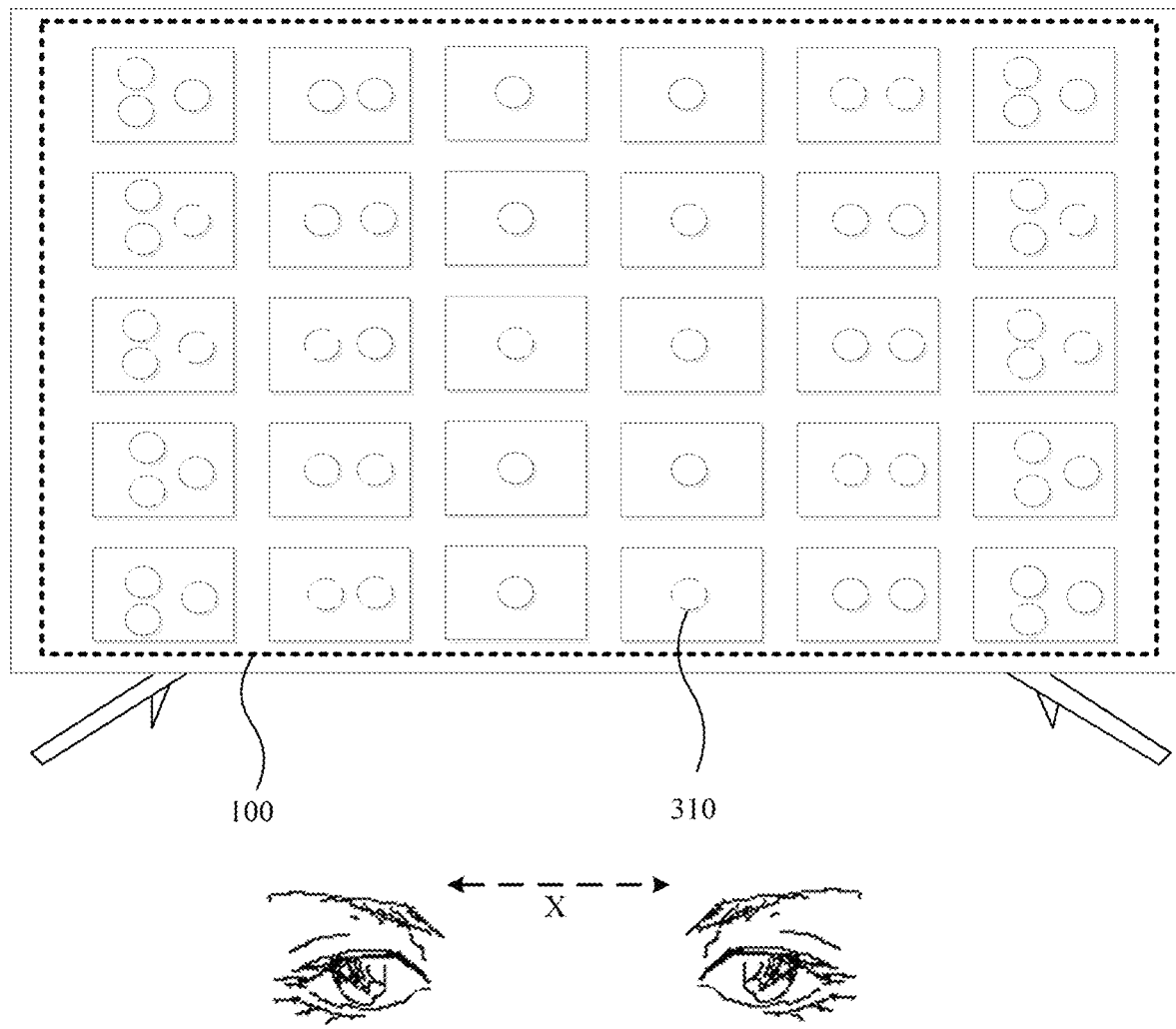
FIG. 4 shows a plane view of concave-convex structures in another OLED display panel according to embodiments of the present disclosure.

In another aspect of this disclosure, as illustrated in FIG. 4, a spatial distribution of the number of the concave-convex structure, which is opposite to the one described above, maybe implemented to compensate another non-uniformity of brightness that the OLED display panel appears to be darker in its periphery versus its center. This kind of non-uniformity of brightness maybe caused by large viewing angle from human eyes to the periphery of the OLED display panel, that less photon flux can reach to human eyes comparing with the center of the OLED display panel. More specifically, the number of the concave-convex structures 310 may be set to gradually decrease from the periphery to the center of the OLED display panel, so as to compensate viewing angle dependent non-uniformity of brightness.

Figure 5:
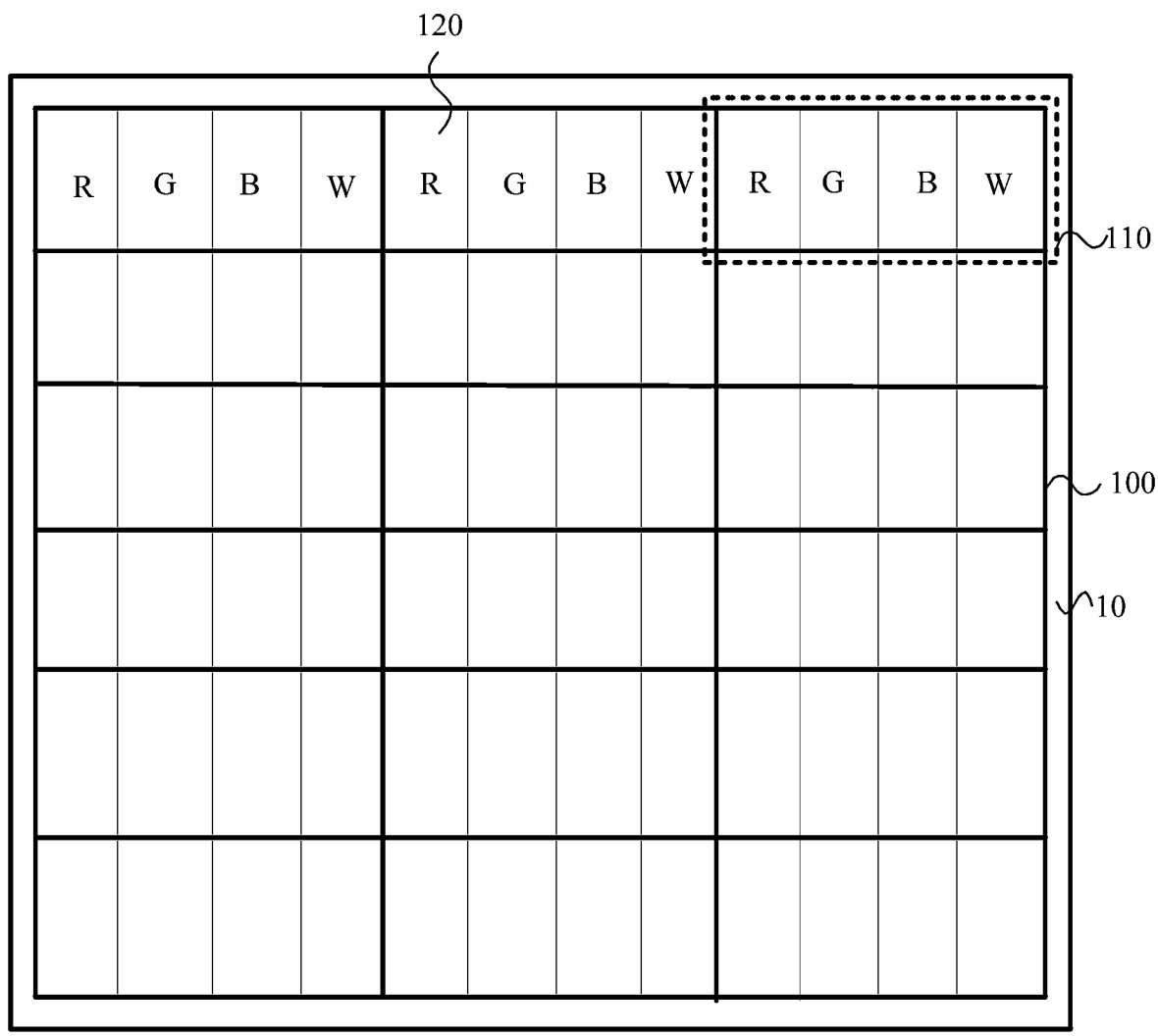
FIG. 5 shows a plane view of another OLED display panel according to embodiments of the present disclosure.

Referring to FIG. 1 and FIG. 5, each pixel 110 in the pixel array 100 in the OLED display panel may include the red sub-pixel R, the green sub-pixel G, and the blue sub-pixel B, or include the red sub-pixel R, the green sub-pixel G, the blue sub-pixel B, and the white sub-pixel W.

Furthermore, the colors of sub-pixels, the number of the sub-pixels and the spatial arrangement of the sub-pixels in the pixel 110 can be changed according to design requirements of the OLED display panel, and are not limited by the embodiments of the present disclosure.

In one embodiment, still referring to FIG. 3, the pixel array 100 further includes first power lines 130 extending along the first direction X. The number of concave-convex structures 310 monotonically decreases from the center of the pixel array 100 to the periphery of the pixel array 100 in a direction of the first power lines 130.

As illustrated in FIG. 3, the OLED display panel includes a driving IC 200, a power bus 300, and the first power lines 130. When the OLED display panel performs a display, the driving IC 200 drives the sub-pixels 120 by outputting the driving voltage to the first power lines 130 through the power bus 300. Since the first power lines 130 extend along the first direction X and the driving voltage of the sub-pixels 120 in a peripheral region of the OLED display panel supplied by the peripheral driving IC chip does not need to go through various distances to reach the sub-pixels in the peripheral region, a relatively small voltage drops may be achieved. However the driving voltage of the sub-pixels 120 near the center of the OLED display panel need to go through various distances to reach the sub-pixels in the center region, a relatively large voltage drop will occurs, so that the center of the OLED display panel appears to be darker than the periphery of the OLED display panel. As a result, the increased number of the concave-convex structure near the center of the OLED display panel may lift the brightness near the center to the level approximately equal to the brightness in the peripheral of the OLED display panel.

Figure 6:
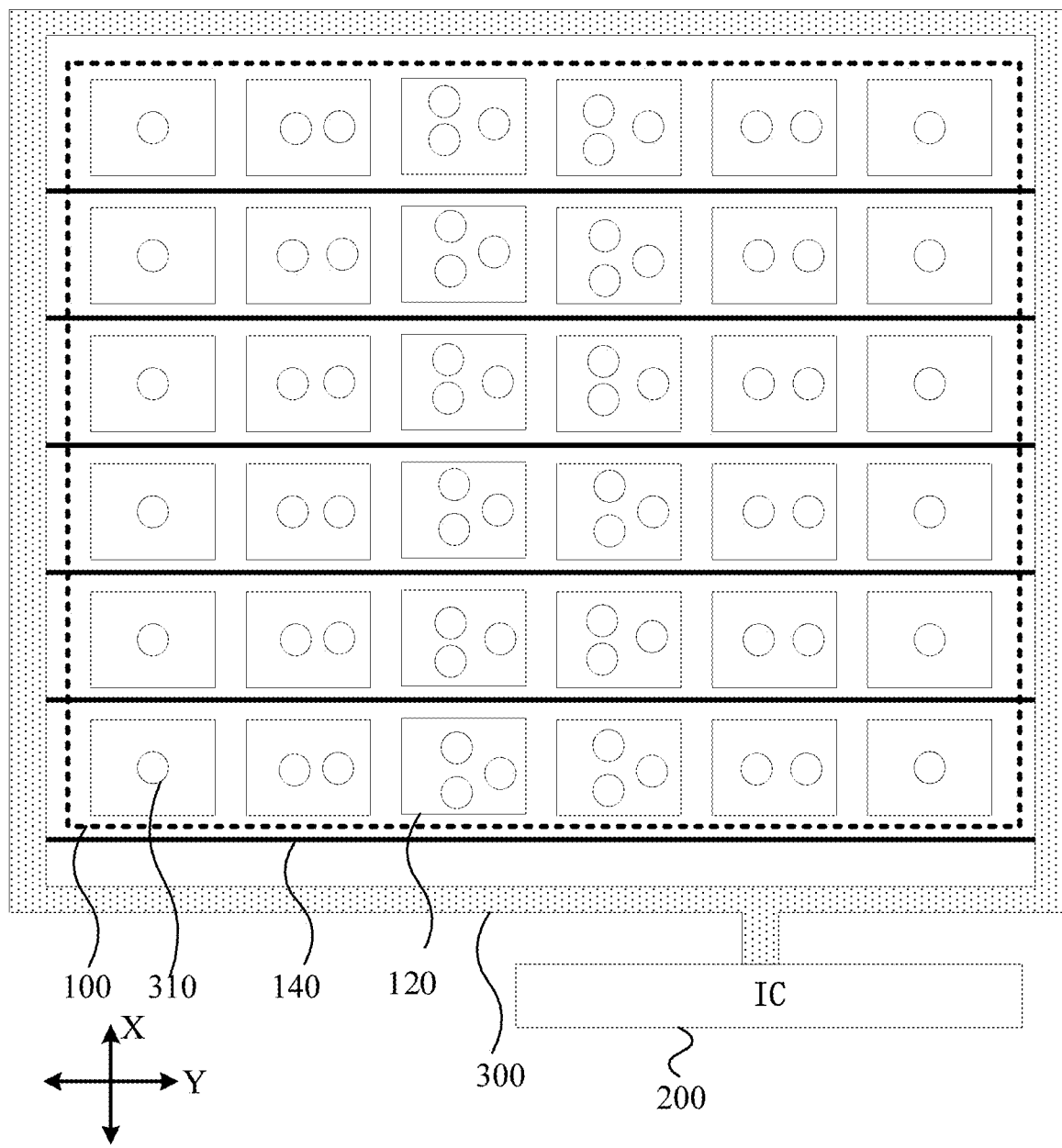
FIG. 6 shows a plane view of concave-convex structures in an OLED display panel according to embodiments of the present disclosure.

In one embodiment, as illustrated in FIG. 6, the pixel array 100 further includes second power lines 140 extending along the second direction Y. The number of concave-convex structures 310 monotonically decreases from the center to the periphery of the OLED display panel in a direction of the second power lines 140.

When the second power lines 140 extend along the second direction Y, the number of concave-convex structures 310 is set to monotonically decrease from the center of the pixel array 100 to the periphery of the pixel array 100 in the direction of the second power lines 140 according to principles consistent with those in FIG. 3, which are not repeated here.

Figure 7:
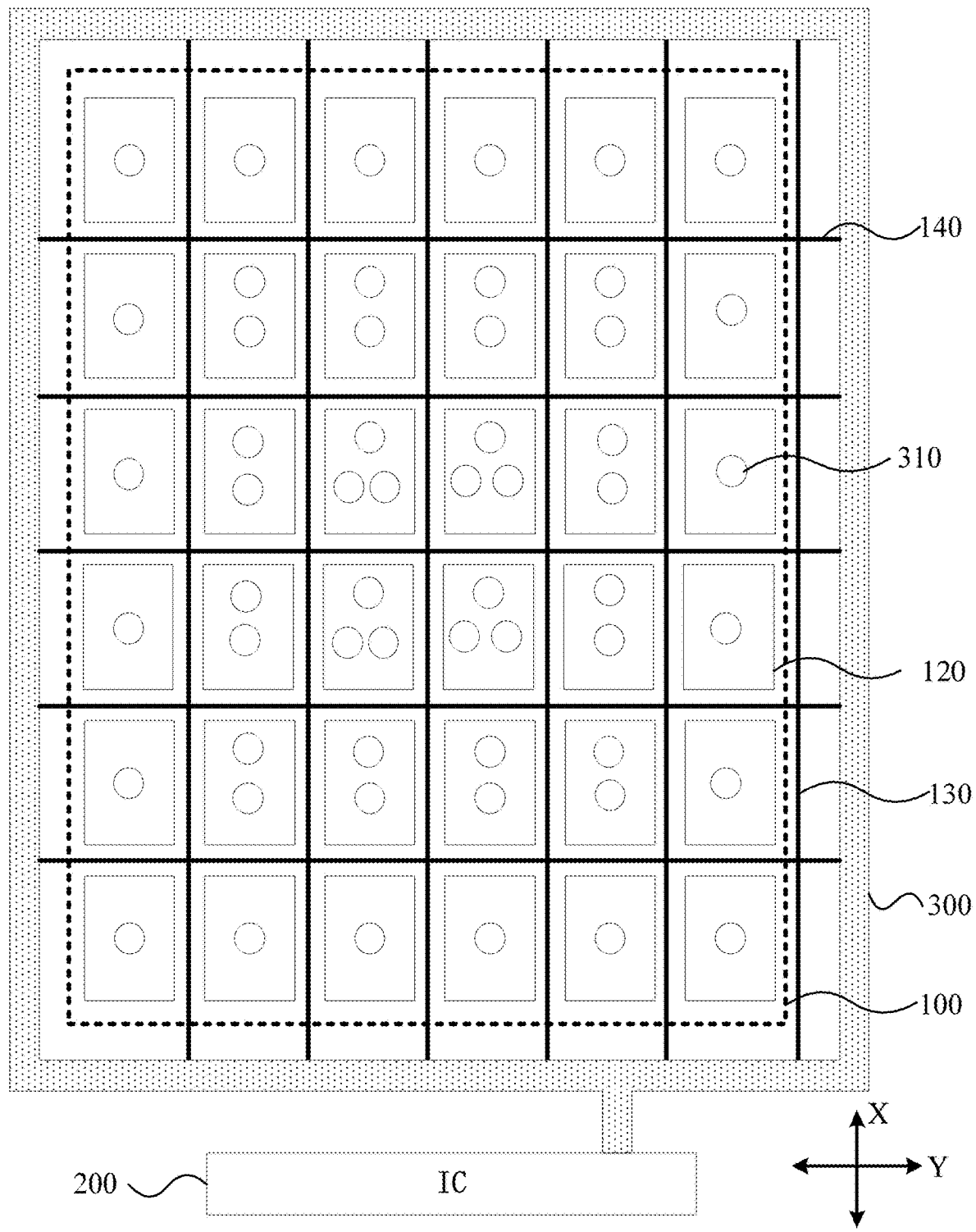
FIG. 7 shows a plane view of concave-convex structures in another OLED display panel according to embodiments of the present disclosure.

Furthermore, as illustrated in FIG. 7, when the pixel array 100 includes both the first power lines 130 extending along the first direction X and the second power lines 140 extending along the second direction Y, the concave-convex structures 310 in the sub-pixel 120 in the pixel array 100 monotonically decrease from the center of the pixel array 100 in the first direction X and the second direction Y, that is, an arrangement of the concave-convex structures in the pixel array tends to be center-symmetric.

In one embodiment, still referring to FIG. 4, the first direction X is parallel to a line connecting eyes of an observer. The number of concave-convex structures 310 monotonically increases from the center to the periphery of the OLED display panel in the first direction X.

Furthermore, when the first direction X is parallel to the line connecting the eyes of the observer, the OLED display panel appears to be darker in its periphery versus its center. This kind of non-uniformity of brightness maybe caused by large viewing angle from human eyes to the periphery of the OLED display panel and the large size of the OLED display panel, that less photon flux can reach to human eyes comparing with the center of the OLED display panel. More specifically, the number of the concave-convex structures 310 may be set to gradually decrease from the periphery to the center of the OLED display panel, so as to compensate viewing angle dependent non-uniformity of brightness.

In one embodiment, the more concave-convex structures 310 in the sub-pixel 120, the lower driving voltage the light-emitting layer of the sub-pixel 120 has.

The driving circuit of the pixel in the OLED display panel includes at least one driving transistor connected in series with the light-emitting layer. A gate voltage of the driving transistor is adjusted, so that equivalent series resistance of the driving transistor is changed and a voltage consumed across the driving transistor is changed accordingly. In order to ensure that sub-pixels of different colors emit the same number of photons and thus improve the display effect of the OLED display panel, for an applied voltage of a same magnitude, a voltage applied across the light-emitting layer 40 can be changed. More specifically, the more concave-convex structures 310 the light-emitting layer 40 correspond to, the lower driving voltage the light-emitting layer 40 can have. Therefore, when there are more concave-convex structures 310 in the sub-pixel, the driving voltage of the light-emitting layer 40 of the sub-pixel may be set to be lower to ensure that the photon number emitted by the sub-pixels of different colors remains unchanged.

It is to be noted that a relationship between the gate voltage of the driving transistor and the driving voltage of the light-emitting layer may be adjusted according to the polarity of the VDD of the driving circuit and whether the driving circuit of the pixel adopts an NMOS or a PMOS.

Furthermore, assuming that the light-emitting layers 40 of the sub-pixels emit the same photon number, the light-emitting layer with more concave-convex structures 310 can has the slightly lower driving voltage since it has a relatively larger effective light-emitting area. Although the photon number per unit area of the light-emitting layer 40 decreases due to the decrease of the driving voltage, the increase in the light-emitting area of the light-emitting layer 40 can compensate for the decrease of the driving voltage, thereby ensuring that the total photon number emitted by the sub-pixels of different colors remains unchanged. In the related art, the photon number emitted by each sub-pixel may be adjusted by changing the driving voltage or a pixel size. When the pixels have the same size in the OLED display panel, the photon number can merely be adjusted by changing the driving voltage. However, in the embodiments of the present disclosure, the photon number can be adjusted by increasing or decreasing the number of concave-convex structures on a light-emitting surface of the light-emitting layer in the sub-pixel of the different color, which expands a brightness contrast and a dynamic brightness display range of a display picture.

In one embodiment, the OLED display panel includes a bending portion and a non-bending portion. The number of concave-convex structures 310 in a sub-pixel 120 in the bending portion is less than that in a sub-pixel 120 in the non-bending portion.

When the OLED display panel includes the bending portion, due to the leakage of part of light in large angle at a bending positon of the OLED display panel or a focusing effect of a convex lens at the bending position of the OLED display panel, the human eyes will feel a brighter display at the bending position of the OLED display panel. Therefore, the number of concave-convex structures in the sub-pixel 120 in the bending portion may be appropriately reduced, thereby lowering display brightness of the bending portion, and ensuring uniformity of display brightness of the OLED display panel.

In one embodiment, the concave-convex structures 310 in the OLED display panel have a same shape.

The concave-convex structures 310 in the OLED display panel are set to have the same shape, that is, a same mask is used in the manufacturing process to manufacture the concave-convex structures in the sub-pixel 120, which reduces complexity of the manufacturing process and improves manufacturing efficiency.

In one embodiment, the concave-convex structures 310 are uniformly distributed within the sub-pixel 120.

The uniform arrangement of the concave-convex structures 310 can avoid that the concave-convex structures 310 are densely distributed within some sub-pixels 120 and sparsely distributed within some sub-pixels 120, and that some concave-convex structures are close to a center of the sub-pixel and some concave-convex structures are close to an edge of the sub-pixel, and thereby can simplify a manufacturing process of the concave-convex structures.

In one embodiment, still referring to FIG. 2, a maximum height difference h of the concave-convex structure is greater than a thickness d of the light-emitting layer 40.

In a manufacturing process of the OLED display panel, the light-emitting layer 40 is generally formed on the uneven layer 30 by means of evaporation. When the light-emitting layer 40 is manufactured by using an evaporation process in the related art, the applicant has found that when the maximum height difference h is greater than the thickness d of the light-emitting layer 40, the light-emitting area of the light-emitting layer will be significantly increased, and light-emitting efficiency of a light-emitting element of the OLED display panel can be improved. When the maximum height difference h is relatively small, the light-emitting area of the light-emitting layer 40 disposed on the concave-convex structures 310 is relatively small, and the enhancement of the light-emitting efficiency is nearly negligible. For example, when the thickness d of the light-emitting layer 40 in the OLED display panel formed by using the evaporation process is 100 nm, and the maximum height difference h is greater than 100 nm, the light-emitting efficiency of the light-emitting element will be significantly improved.

Due to the manufacturing process variations, the concave-convex structures 310 which are periodically arranged may not necessarily be exactly the same, as long as it is ensured that a distance between two adjacent protrusions of the concave-convex structures 310 is equal or a distance between two adjacent valleys of the concave-convex structures 310 is equal, which means that the concave-convex structures 310 are periodically arranged in a broad sense.

Furthermore, still referring to FIG. 2, a distance L between two adjacent protrusions of the concave-convex structures 310 is not less than two fold of the thickness d of the light-emitting layer 40.

As shown in FIG. 1, the position of a protrusion in a concave-convex structure 310A is at a point A, the position of a protrusion in a concave-convex structure 310B is at a point B, L donates a distance between the position A of the protrusion in the concave-convex structure 310A and the position B of the protrusion in the concave-convex structure 310B, d donates the thickness of the light-emitting layer, and L and d satisfy that L≥2d.

Since the uneven layer 30 includes the concave-convex structures 310, a break may easily occur in the light-emitting layer 40 in the process of forming the light-emitting layer 40 by means of evaporation on a surface of the concave-convex structures 310. To ensure that the light-emitting layer 40 is in close contact with the concave-convex structures 310 in the uneven layer 30 and to avoid the phenomenon that the light-emitting layer 40 breaks due to an internal stress of the light-emitting layer 40 in the evaporation process, the distance L between two adjacent protrusions of the concave-convex structures 310 and the thickness d of the light-emitting layer may be set to satisfy that L≥2d, reducing the internal stress of the light-emitting layer 40 and thereby avoiding the problem of breaking of the light-emitting layer 40.

Different curved shapes may be selected for the uneven layer provided in the embodiments of the present disclosure according to practical design requirements. For example, as shown in FIG. 2, the uneven layer 30 includes the plurality of concave-convex structures 310 which is periodically arranged and has the same shape. A surface profile of the concave-convex structures 310 periodically arranged manifests in a sine shape.

In one embodiment, still referring to FIG. 2, the uneven layer 30 includes the plurality of concave-convex structures 310 periodically arranged, and the maximum height difference h of the concave-convex structure is not less than one third of the distance L between two adjacent protrusions of the concave-convex structures and is less than or equal to twice L.

As shown in FIG. 2, when the surface profile of the concave-convex structures 310 periodically arranged manifests in the sine shape, a function of the surface profile of the concave-convex structures 310 is set to satisfy:

$$Y(x) = \frac{h}{2}\left(1 + \cos\left(\frac{2\pi}{L}x\right)\right). \quad (1)$$

The function in formula (1) is derived to obtain an inclination angle $\theta_m$ of a maximum slope of the surface profile of the concave-convex structures 310 which satisfies:

$$\theta_m = \arctan\left(\frac{\pi h}{L}\right), \quad (2)$$

Here h still donates a protrusion height in the sine waveform surface profile, and L still donates the distance between the two adjacent protrusions of the concave-convex structures 310 in the sine waveform surface profile.

When the inclination angle $\theta_m$ is selected as 75°, the formula (2) is solved to obtain that $$\frac{h}{L} = 1.19.$$

The applicant has found that when the maximum height difference h and the distance L satisfy that $$\frac{1}{3} \le \frac{h}{L} \le 2,$$

and therefore the inclination angle ranges between 43° and 81°, the effective light-emitting area of the light-emitting layer increases significantly while risks of breaking in the light-emitting layer 40 is negligible. It is therefore preferred to make the maximum height difference h and the distance L be set to satisfy that $$\frac{1}{3} \le \frac{h}{L} \le 2.$$

Though the above preference in making surface topology of the concave-concave structure 310 is concluded from a sine wave surface profile, it is perhaps applicable to other surface profiles as well.

In one embodiment, a minimum radius of curvature p of the concave-convex structures 310 in the uneven layer 30 is not less than half the thickness of the light-emitting layer 40.

In an example in which the surface profile of the concave-convex structures 310 manifests in the sine wave shapes, when the surface profile of the concave-convex structures 310 periodically arranged manifests in the sine wave shapes and satisfies the formula (1), an expression of a radius of curvature at a peak position (i.e., the protrusion of the concave-convex structure) of the surface of the concave-convex structure 310 may be solved for and satisfies:

$$\rho = \frac{L^2}{2\pi^2 h} \quad (3)$$

Since the radius of curvature at the protrusion of the concave-convex structure 310 is the smallest, the light-emitting layer 40 evaporated on the concave-convex structure 310 has the largest internal strain, and the concave-convex structure 310 easily breaks. To avoid the breakage of the light-emitting layer 40 due to the internal strain of the light-emitting layer 40, the minimum radius of curvature ρ of the concave-convex structure 310 and the thickness d of the light-emitting layer 40 are set to satisfy that $$\rho \ge \frac{d}{2},$$

that is, $$\frac{L^2}{2\pi^2 h} \geq \frac{d}{2}. \qquad (5)$$

For example, when the thickness d of the light-emitting layer 40 is set to 100 nm, and the distance L between the protrusions of adjacent concave-convex structures 310 is set to 1000 nm, a value range of h may be obtained according to $$\frac{L^2}{2\pi^2 h} \geq \frac{d}{2} \text{ and } \frac{1}{3} \leq \frac{h}{L} \leq 2,$$

and then the concave-convex structure in the uneven layer is determined.

Furthermore, it is derived from formulas (1) to (3) that an increase ratio of the effective light-emitting area, hereafter denoted by RP, after adding the uneven layer 30 can be described by a formula:

$$RP = \frac{2}{\pi^2} \cdot \int_0^\pi \left( \sqrt{1 + \left(\frac{\pi h}{L}\right)^2 \sin^2(t)} \right) dt \qquad (4)$$

Figure 8:
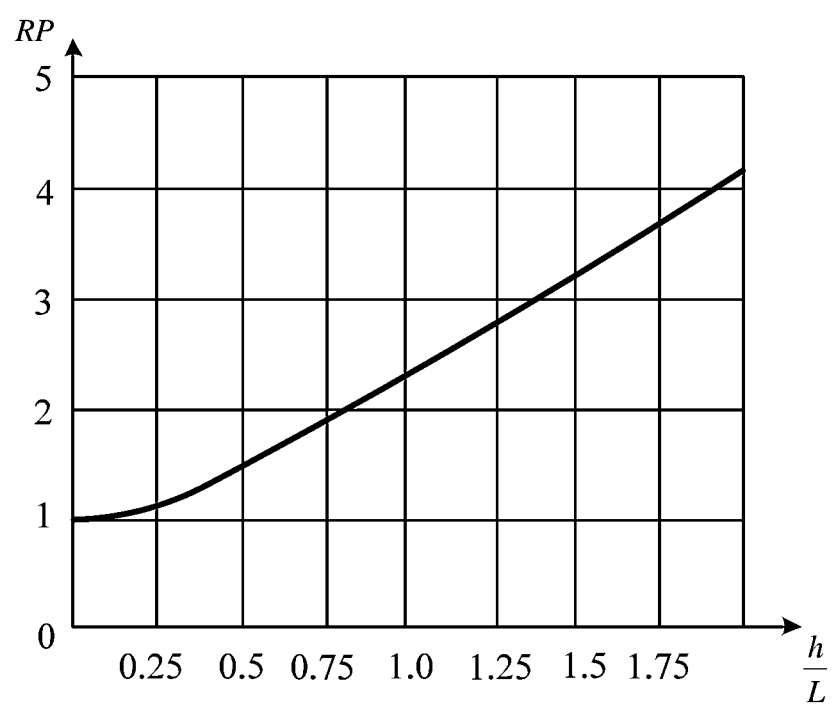
FIG. 8 shows a plot of simulation results for enhancement in effective light emitting area according to embodiments of the present disclosure.

Computation of RP value for a parameter of the height difference h and the distance L is performed, and the results are plotted in FIG. 8. As shown in FIG. 6, when a ratio of the height difference h and the distance L is near 1, the effective light-emitting area is increased by 2.2 fold, and similar boosts in light output in the OLED display panel is expected as well.

It is to be noted that the above embodiments are described by taking the surface profile of the concave-convex structures 310 which manifests in the sine wave shape as an example. However, in practical product production, due to manufacturing process differences and other reasons, the beneficial effects of the present disclosure can be achieved within a certain size error range, for example, when the surface profile of the concave-convex structures 310 manifests in approximately the sine wave shape or approximates to the sine wave shape. Therefore, a concave-convex curved surface which manifests in approximately a sine wave shape or approximates to the sine wave shape is within the scope of the present disclosure.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting diode (OLED) display panel, comprising:
a substrate; and
a pixel array disposed on the substrate and comprising a plurality of pixels arranged in an orthogonal matrix; wherein each of the plurality of pixels comprises a plurality of sub-pixels, and each of the plurality of sub-pixels comprises a driving circuit layer, an uneven layer, and a light-emitting layer stacked in manufacture processing sequence;
wherein the uneven layer in each of the sub-pixels comprises a plurality of concave-convex structures;
wherein a number of concave-convex structures of each of the sub-pixels in the pixel array decreases or increases from a center of the pixel array to a periphery of the pixel array in at least one of a first direction and a second direction, wherein the first direction and the second direction are orthogonal to each other.

2. The OLED display panel of claim 1, wherein the pixel array further comprises first power lines extending along the first direction; and the number of concave-convex structures decreases from the center of the pixel array to the periphery of the pixel array in a direction of the first power lines.

3. The OLED display panel of claim 1, wherein the pixel array further comprises second power lines extending along the second direction; and the number of concave-convex structures of each of sub-pixels in the pixel array decreases from the center of the pixel array to the periphery of the pixel array in a direction of the second power lines.

4. The OLED display panel of claim 1, comprising a bending portion and a non-bending portion; wherein a number of concave-convex structures in a sub-pixel in the bending portion is less.

5. The OLED display panel of claim 1, wherein the plurality of concave-convex structures in the OLED display panel has a same shape.

6. The OLED display panel of claim 1, wherein the plurality of concave-convex structures is uniformly distributed within each of the plurality of sub-pixels (120).

7. The OLED display panel of claim 1, wherein a maximum height difference of each of the plurality of concave-convex structures is greater than a thickness of the light-emitting layer.

8. The OLED display panel of claim 1, wherein a distance L between two adjacent protrusions of the plurality of concave-convex structures is not less than two fold of a thickness of the light-emitting layer.

9. The OLED display panel of claim 1, wherein a surface profile of the plurality of concave-convex structures manifests in a sine wave shape.

10. The OLED display panel of claim 1, wherein a maximum height difference of each of the plurality of concave-convex structures is not less than one third of a distance L between two adjacent protrusions of the plurality of concave-convex structures and is less than or equal to twice the distance L.

11. The OLED display panel of claim 1, wherein a minimum radius of curvature p of the plurality of concave-convex structures in the uneven layer is not less than half the thickness of the light-emitting layer.

* * * * *